(12) United States Patent
Kamiya

(10) Patent No.: US 10,103,206 B2
(45) Date of Patent: Oct. 16, 2018

(54) DISPLAY DEVICE AND MANUFACTURING METHOD OF THE SAME

(71) Applicant: Japan Display Inc., Tokyo (JP)

(72) Inventor: Akinori Kamiya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/379,892

(22) Filed: Dec. 15, 2016

(65) Prior Publication Data

US 2017/0243926 A1    Aug. 24, 2017

(30) Foreign Application Priority Data

Feb. 24, 2016   (JP) .................................. 2016-032970

(51) Int. Cl.
*H01L 27/32* (2006.01)
*H01L 51/50* (2006.01)

(52) U.S. Cl.
CPC ........ *H01L 27/322* (2013.01); *H01L 27/3211* (2013.01); *H01L 27/3272* (2013.01); *H01L 51/5036* (2013.01); *H01L 51/5056* (2013.01); *H01L 51/5088* (2013.01); *H01L 51/5096* (2013.01)

(58) Field of Classification Search
None
See application file for complete search history.

(56) References Cited

U.S. PATENT DOCUMENTS

| | | | | |
|---|---|---|---|---|
| 9,166,194 B2* | 10/2015 | Kato | ................... | H01L 51/5253 |
| 9,466,813 B2 | 10/2016 | Kato et al. | | |
| 2005/0285516 A1* | 12/2005 | Godo | .................. | H01L 51/5262 313/506 |
| 2016/0233343 A1* | 8/2016 | Miyairi | ............... | H01L 29/4236 |
| 2016/0293685 A1 | 10/2016 | Kato et al. | | |
| 2016/0293890 A1 | 10/2016 | Kato et al. | | |

FOREIGN PATENT DOCUMENTS

| | | |
|---|---|---|
| JP | 2009-266922 A | 11/2009 |
| JP | 2014-154450 A | 8/2014 |

* cited by examiner

*Primary Examiner* — Michelle Mandala
(74) *Attorney, Agent, or Firm* — TYPHA IP LLC

(57) ABSTRACT

Provided is a manufacturing method of a display device, which includes: forming a first electrode; forming a first insulating film covering an edge portion of the first electrode and having an opening portion overlapping with the first electrode; forming an EL layer over the first electrode and the first insulating film; forming a second electrode over the EL layer; forming a second insulating film over the second electrode so as to overlap with the first insulating film; removing the second insulating film; and forming a sealing film over the second electrode.

25 Claims, 13 Drawing Sheets

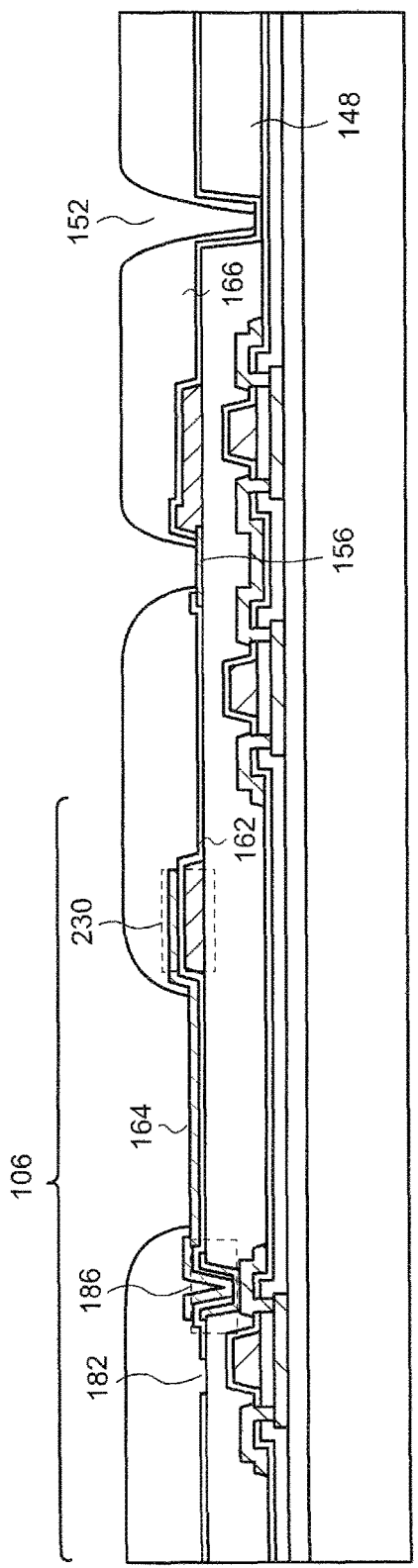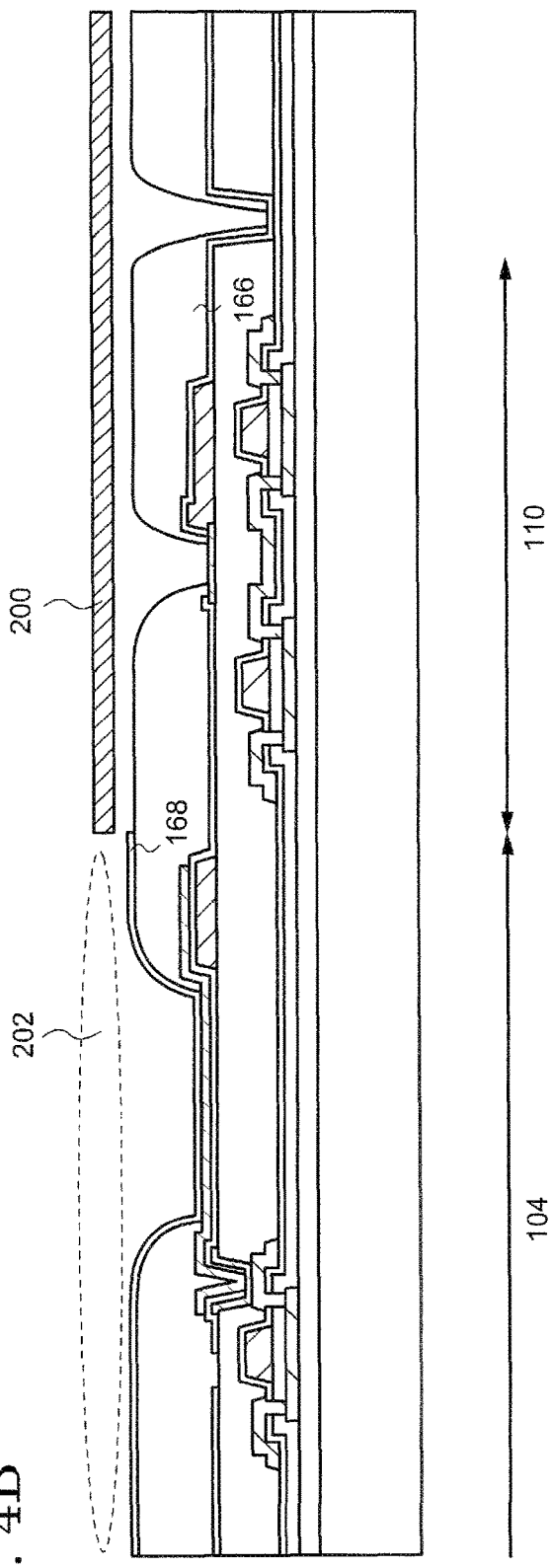
FIG. 4A
FIG. 4B

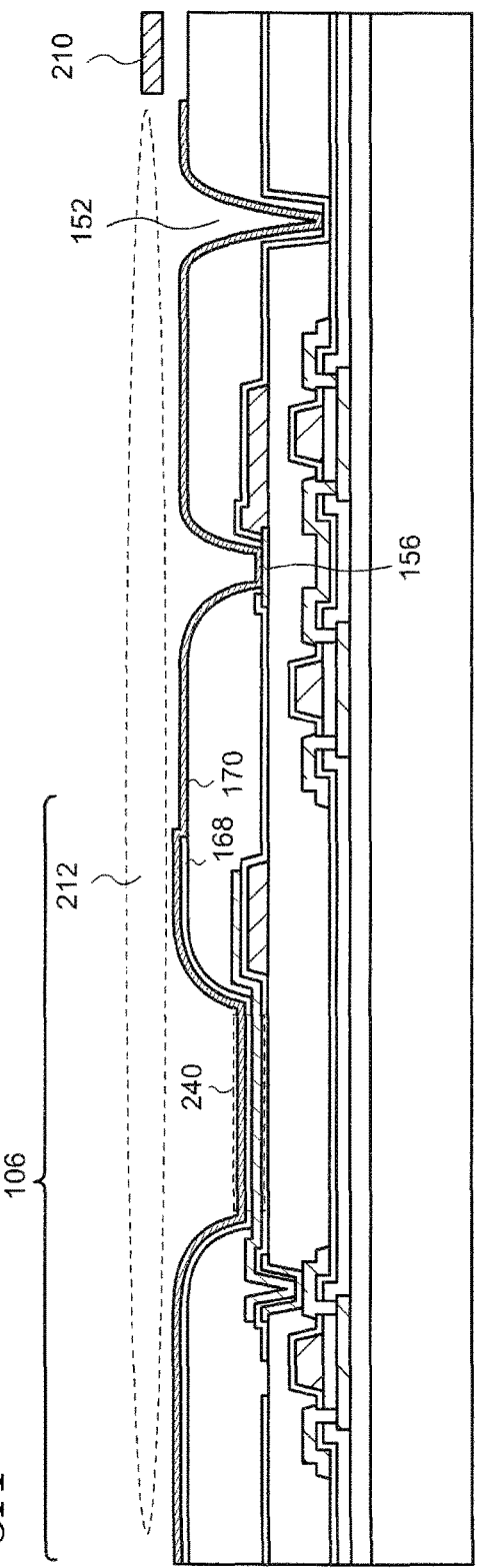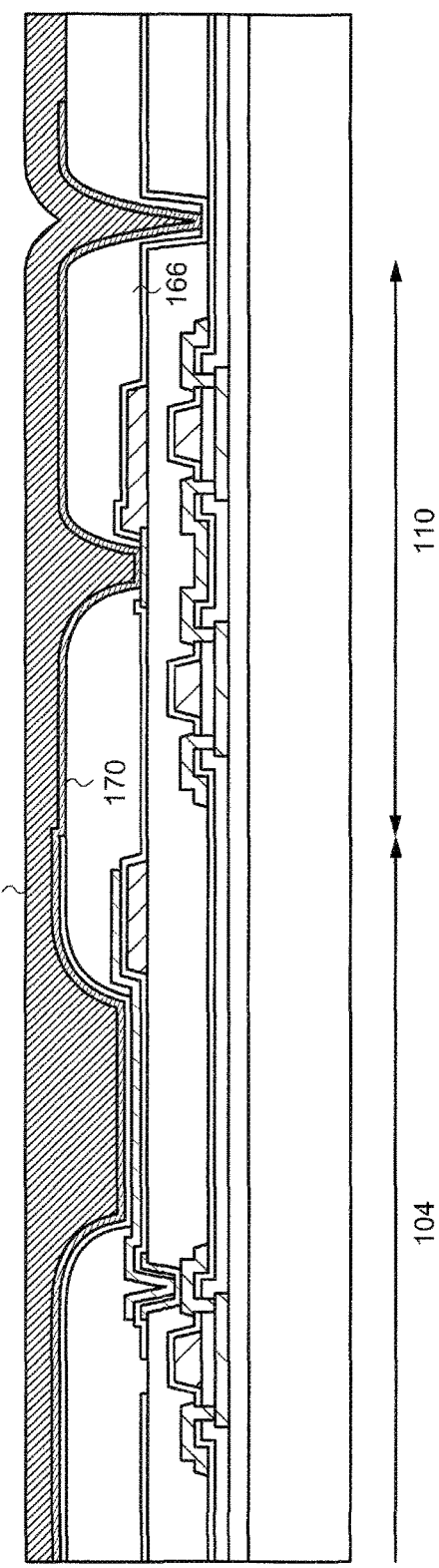

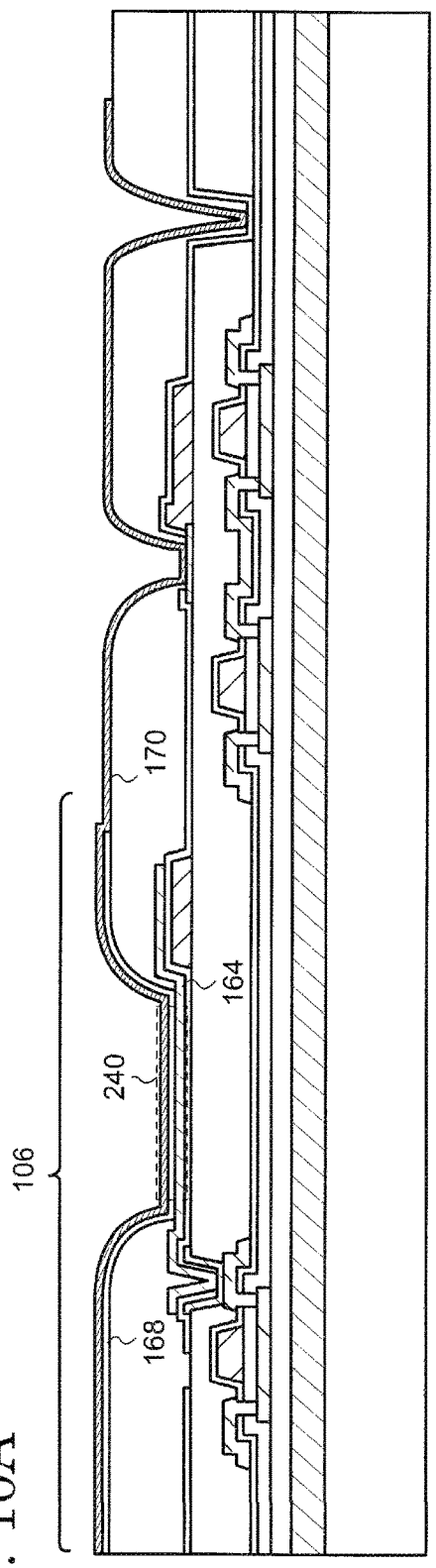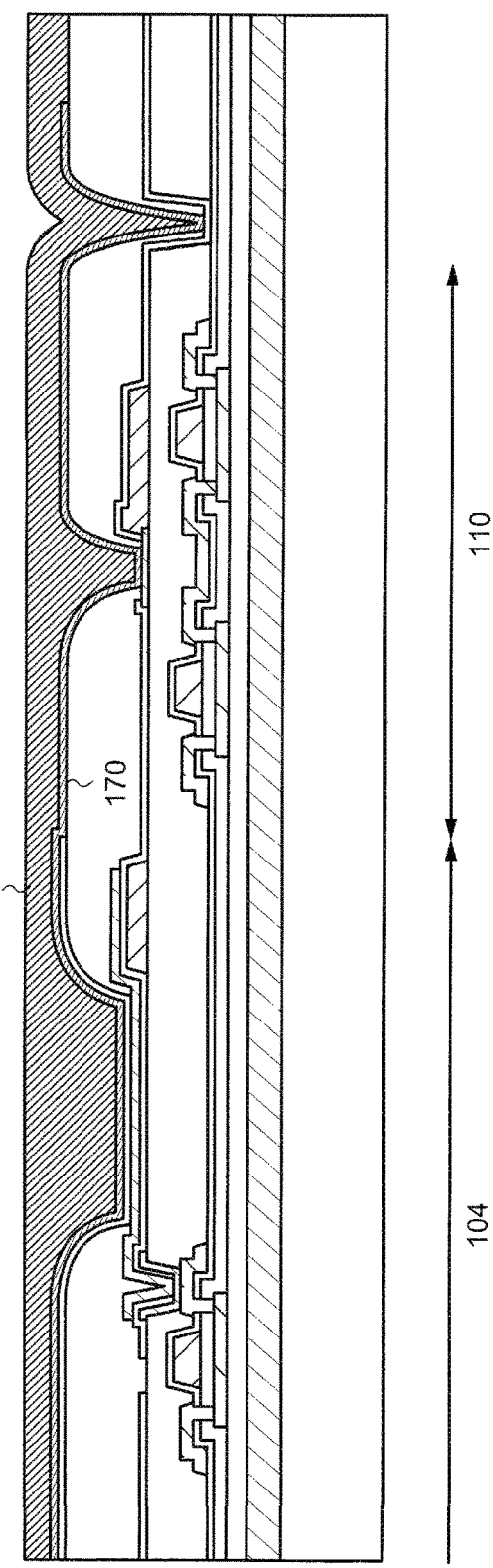

DISPLAY DEVICE AND MANUFACTURING METHOD OF THE SAME

CROSS REFERENCE TO RELATED APPLICATIONS

This application is based on and claims the benefit of priority from the prior Japanese Patent Application No. 2016-032970, filed on Feb. 24, 2016, the entire contents of which are incorporated herein by reference.

FIELD

The present invention relates to a manufacturing method of a display device such as an EL display device and a display device fabricated by the manufacturing method.

BACKGROUND

As a typical example of a display device, a liquid crystal display device and an organic EL (electroluminescence) display device respectively having a liquid crystal element and a light-emitting element in each pixel are represented. These display devices possess a liquid crystal element or an organic light-emitting element (hereinafter, referred to as a light-emitting element) in each of a plurality of pixels formed over a substrate. A liquid crystal element and a light-emitting element have a layer including a liquid crystal and an organic compound, respectively, between a pair of electrodes and are driven by applying a voltage or supplying a current between the pair of electrodes.

Unlike a liquid crystal element, current flows in an organic compound included in a layer (hereinafter, referred to as an EL layer) sandwiched between a pair of electrodes in a light-emitting element. Thus, the organic compound is oxidized or reduced during operation of the light-emitting element and may exist in a state having an electric charge. Furthermore, an excited state is generated by recombination of these active species. Such active species and molecules in an exited state readily react with another organic compound or impurities such as water and oxygen, which enter a light-emitting element, due to their higher reactivity than that of a molecule in an electrically neutral state or a ground state. These kinds of reactions adversely influence performance of a light-emitting element, resulting in reduction of efficiency and lifetime of a light-emitting element.

As a method for suppressing the aforementioned reduction in performance, it is disclosed in Japanese patent application publications No. 2014-154450 and 2009-266922 that a passivation film (sealing film) is formed over a light-emitting element. Since entrance of impurities to a light-emitting element can be prevented or suppressed by the sealing film, it is possible to prevent or suppress the reduction of efficiency and lifetime of a light-emitting element.

SUMMARY

An embodiment according to the present invention is a manufacturing method of a display device. The manufacturing method including: forming a first electrode; forming a first insulating film covering an edge portion of the first electrode and having an opening portion overlapping with the first electrode; forming an EL layer over the first electrode and the first insulating film; forming a second electrode over the EL layer; forming a second insulating film over the second electrode so as to overlap with the first insulating film; removing the second insulating film; and forming a sealing film over the second electrode.

An embodiment according to the present invention is a manufacturing method of a display device. The manufacturing method including: forming a first electrode; forming a first insulating film covering an edge portion of the first electrode and having an opening portion overlapping with the first electrode; forming an EL layer over the first electrode and the first insulating film; arranging a mask having an opening portion between the first insulating film and an evaporation source so as to be in contact with the first insulating film; forming a second electrode over the EL layer through the opening portion of the mask; forming a second insulating film over the second electrode so as to cover a damaged portion of the first insulating film, which results from a contact with the mask, is covered; removing the second insulating film; and forming a sealing film over the second electrode.

An embodiment according to the present invention is a display device including: a first electrode; a first insulating film which covers the first electrode, which has an opening portion overlapping with the first electrode, and which has a depression; an EL layer over the first electrode and the first insulating film; a second electrode over the EL layer; and a sealing film over the second electrode. The sealing film includes: a first layer covering the depression and including an inorganic compound; a second layer over the first layer, the second layer including an organic compound; and a third layer over the second layer, the third layer including an inorganic compound.

BRIEF DESCRIPTION OF DRAWINGS

FIG. 4A and FIG. 4B are drawings showing a manufacturing method of a display device, which is an embodiment of the present invention;

FIG. 5A and FIG. 5B are drawings showing a manufacturing method of a display device, which is an embodiment of the present invention;

FIG. 10A and FIG. 10B are drawings showing a manufacturing method of a display device, which is an embodiment of the present invention;

DESCRIPTION OF EMBODIMENTS

Figure 1:
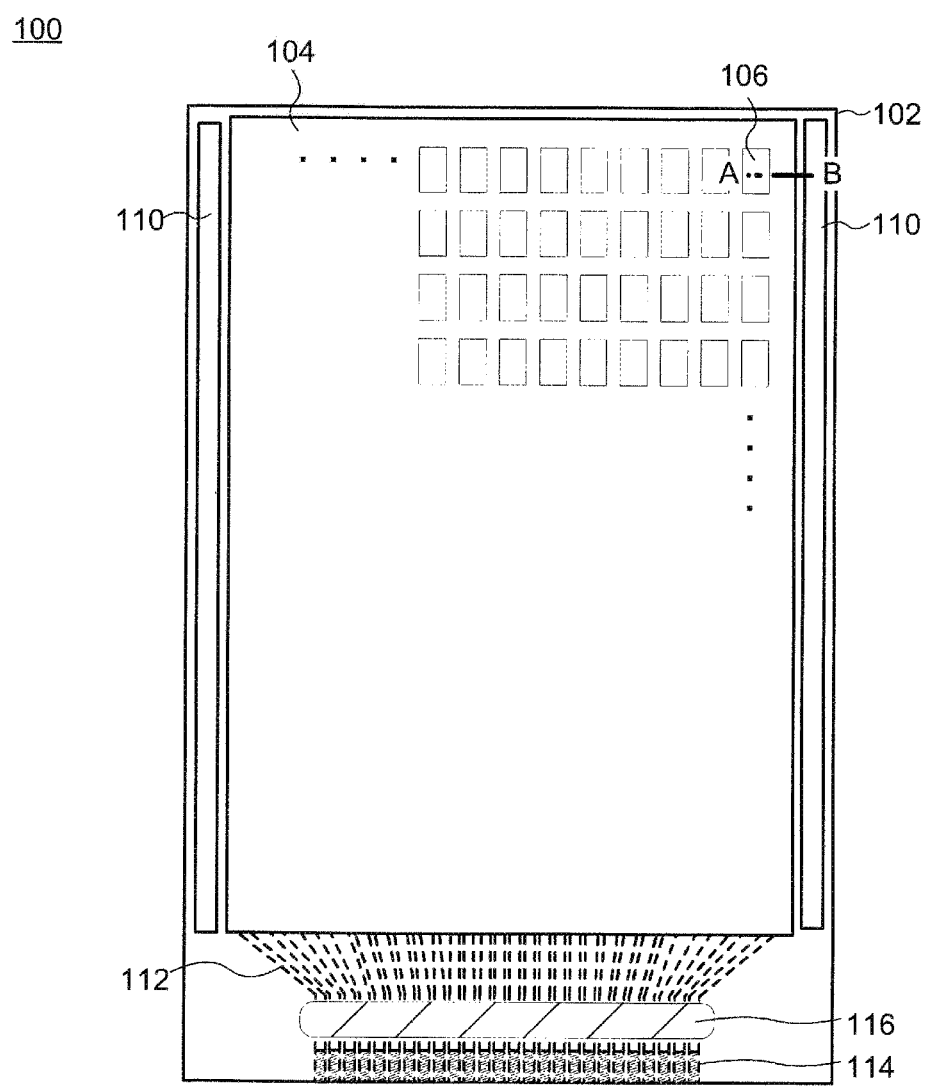
FIG. 1 is a schematic top view of a display device which is an embodiment of the present invention.

Hereinafter, the embodiments of the present invention are explained with reference to the drawings. Note that the present invention can be implemented in a variety of modes within the concept of the invention, and an interpretation should not be limited by the disclosure in the embodiments represented below.

In the drawings, the width, thickness, shape, and the like of each component may be schematically illustrated and different from those of an actual mode in order to provide a clearer explanation. However, the drawings simply give an example and do not limit an interpretation of the present invention. In the specification and each of the drawings, elements which are the same as those explained in the preceding drawings are denoted with the same reference numbers, and their detailed explanation may be omitted appropriately.

In the present invention, when a plurality of films is formed by processing a single film, the plurality of films may have functions or roles different from each other. However, the plurality of films originates from the film which is formed as the same layer in the same process. Therefore, the plurality of films is defined as the films existing in the same layer.

In the invention, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

In the present embodiment, a manufacturing method of a display device according to an embodiment of the present invention and a display device fabricated by the manufacturing method are explained by using FIG. 1 to FIG. 8C.

A top view of the display device 100 according to the present embodiment is shown in FIG. 1. The display device 100 has a display region 104 including a plurality of pixels 106 and gate-side driver circuits (hereinafter, referred to as driver circuits) 110 on a surface (top surface) of a base material 102. Light-emitting elements different in emission color from each other can be disposed in the plurality of pixels 106, by which full color display can be performed. For example, red-emissive, green-emissive, and blue-emissive light-emitting elements can be arranged in three pixels 106, respectively. Alternatively, full-color display may be carried out by using white emissive light-emitting elements in all of the pixels 106 and extracting red, green, and blue colors from the respective pixels 106 with color filters. The colors finally extracted are not limited to a combination of red, green, and blue colors. For example, four colors of red, green, blue, and white can be extracted from four pixels 106, respectively. There is no limitation to an arrangement of the pixels 106, and a stripe arrangement, a delta arrangement, a Pentile arrangement, and the like may be employed.

Wirings 112 extend from the display region 104 to a side surface (short side of the display device 100 in FIG. 1) of the base material 102. The wirings 112 are exposed at an edge portion of the base material 102, and the exposed portions form terminals 114. The terminals 114 are connected to a connector (not shown) such as a flexible printed circuit (FPC). The display region 104 is also electrically connected to an IC chip 116 via the wirings 112, by which image signals supplied from an external circuit (not shown) are provided to the pixels 106 via the driver circuits 110 and the IC chip 116, emission of the pixels 106 is controlled, and an image is reproduced on the display region 104. Note that, although not shown, the display device 100 may possess a source-side driver circuit instead of the IC chip 116 at a periphery of the display region 104. In the present embodiment, two driver circuits 110 are provided so as to sandwich the display region 104. However, a single driver circuit 110 may be disposed. Furthermore, the driver circuits 110 may not be formed over the base material 102, and a driver circuit 110 formed over another substrate may be formed over the connector.

A manufacturing method of the display device 100 is shown in FIG. 2A to FIG. 6B. FIG. 2A to FIG. 6B are cross-sectional views along dot-dash line A-B of FIG. 1 and schematically show one pixel 106 of the display region 104, which is the closest to the driver circuit 110, the driver circuit 110, and a peripheral structure thereof.

Figure 2A:
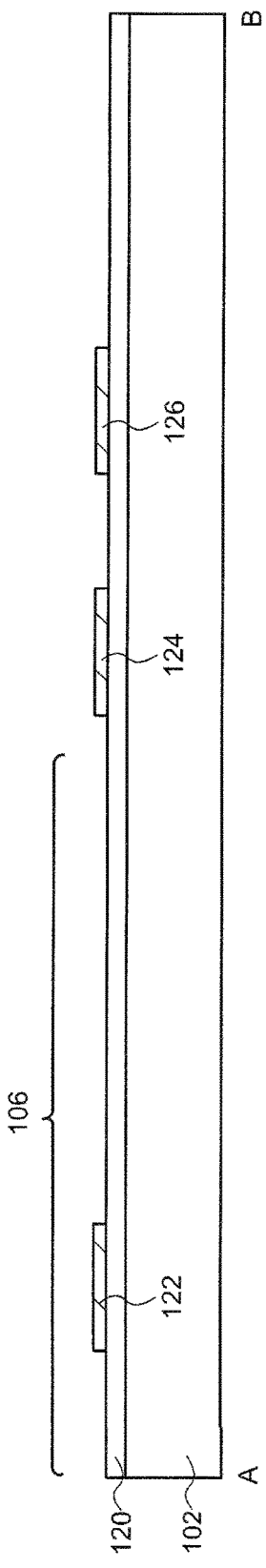
FIG. 2A to FIG. 2C are drawings showing a manufacturing method of a display device, which is an embodiment of the present invention.

First, an undercoat 120 is formed over the base material 102 (FIG. 2A). The base material 102 has a function to support the display region 104, the driver circuits 110, and the like. Therefore, a material having physical strength for supporting the display region 104, the driver circuits 110, and the like, heat resistance to the temperature of the process for fabricating elements (transistors 222, 224, and 226, a capacitor 230, a light-emitting element 240, and the like described below) formed over the base material 102, and chemical stability to chemicals used in the process can be used. Specifically, the base material 102 can include glass, quartz, plastics, a metal, ceramics, and the like. When flexibility is provided to the display device 100, a material including plastics can be used, and a polymer material exemplified by a polyimide, a polyamide, a polyester, and a polycarbonate can be employed.

The undercoat 120 is a film having a function to prevent impurities from being diffused from the base material 102 to semiconductor films 122, 124, and 126 and the like and can be formed with an inorganic compound such as silicon nitride, silicon oxide, silicon nitride oxide, and silicon oxynitride by applying a chemical vapor deposition method (CVD method), a sputtering method, and the like.

Next, the semiconductor films 122, 124, and 126 of the transistors 220, 222, and 224 are formed over the undercoat 120 (FIG. 2A). The semiconductor films 122, 124, and 126 may be formed with a material exhibiting semiconductor properties, such as silicon, germanium, or an oxide semiconductor, by using a CVD method, a sputtering method, and the like. Crystallinity of the semiconductor films 122, 124, and 126 is also not particularly limited, and the semiconductor films 122, 124, and 126 may have single crystalline, polycrystalline, microcrystalline, amorphous morphology, and the like.

Figure 2B:
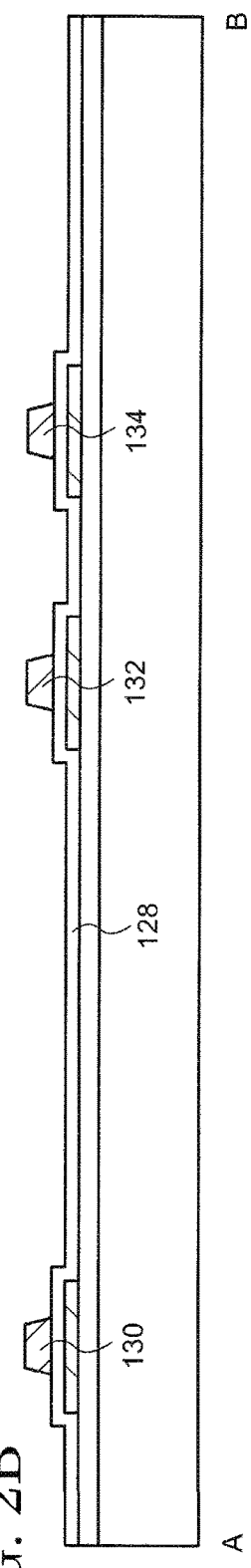

Next, a gate insulating film 128 is formed over the semiconductor films 122, 124, and 126, over which gates 130, 132, and 134 are formed (FIG. 2B). The gate insulating film 128 may also be formed with the same material and the same formation method as those of the undercoat 120 and preferably includes silicon oxide. The undercoat 120 and the gate insulating film 128 each may have a single-layer structure or a stacked-layer structure having a plurality of layers. In FIG. 2B, the undercoat 120 and the gate insulating film 128 are each illustrated so as to have a single-layer structure.

The gates 130, 132, and 134 can be formed with a metal such as titanium, aluminum, copper, molybdenum, tungsten, and tantalum or an alloy thereof so as to have a single-layer or stacked-layer structure. For example, a stacked-layer structure in which a highly conductive metal such as aluminum and copper is sandwiched by a metal with a high melting point, such as titanium and molybdenum, may be employed. As a formation method of the gates 130, 132, and 134, a sputtering method, a CVD method, a printing method, or the like are given.

Figure 2C:
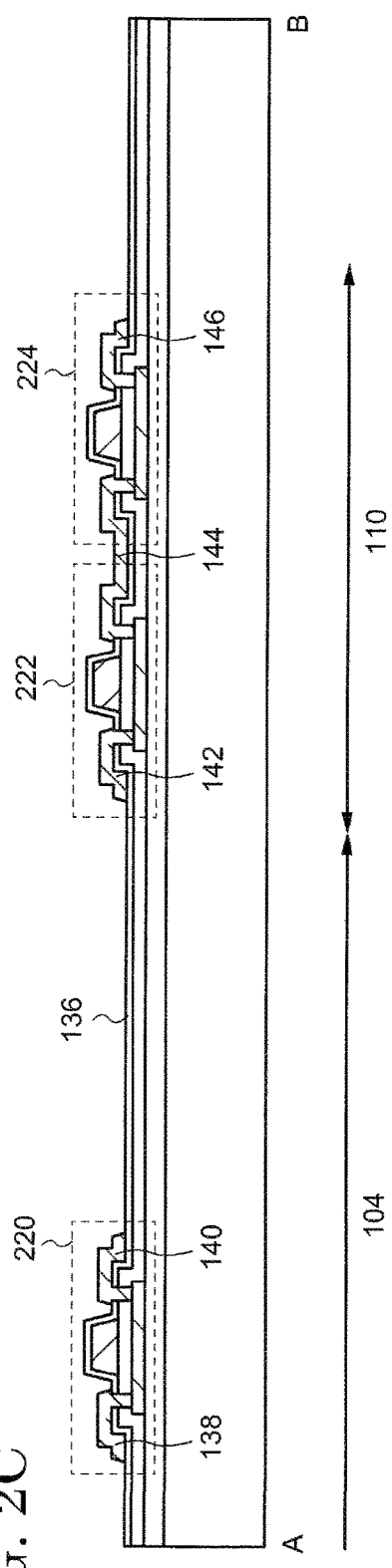

After the formation of the gates 130, 132, and 134, an interlayer film 136 is formed (FIG. 2C). The interlayer film 136 can be formed with a material and a formation method which are the same as those of the undercoat 120 and preferably includes silicon nitride. The interlayer film 136 may have a single-layer structure as shown in FIG. 2C or may be structured with a plurality of layers. For example, the interlayer film 136 can be formed by stacking a film including silicon nitride and a film including silicon oxide.

Next, the interlayer film 136 and the gate insulating film 128 are processed to form openings reaching the semiconductor films 122, 124, and 126. After that, source/drains 138, 140, 142, 144, and 146 are formed, by which the source/drains 138 and 140 are electrically connected to the semiconductor film 122, the source/drains 142 and 144 are electrically connected to the semiconductor film 124, and the source/drains 144 and 146 are electrically connected to the semiconductor film 126. The source/drains 138, 140, 142, 144, and 146 can be formed with a material usable in the gates 130, 132, and 134 by using a CVD method or a sputtering method. Similar to the gates 130, 132, and 134, the source/drains 138, 140, 142, 144, and 146 may have any of a single-layer structure and a stacked-layer structure. Note that, with respect to the source/drains 138, 140, 142, 144, and 146, definition of the source and the drain varies depending on the polarity of the transistors 220, 222, and 224 and a relationship of the potentials applied thereto.

Through the aforementioned steps, the transistors 220, 222, and 224 are formed. Note that an example is shown in FIG. 2C in which one transistor 220 is included in one pixel 106. However, each pixel 106 may have a plurality of transistors. Furthermore, although each of the transistors 220, 222, and 224 shown in FIG. 2C has a top-gate structure, there is no limitation to the structure of the transistors 220, 222, and 224, and the transistors 220, 222, and 224 may have a bottom-gate structure. Additionally, polarity of the transistors 220, 222, and 224 is not limited, and the transistors 220, 222, and 224 may have any polarity selected from an N-channel type and a P-channel type.

Figure 3A:
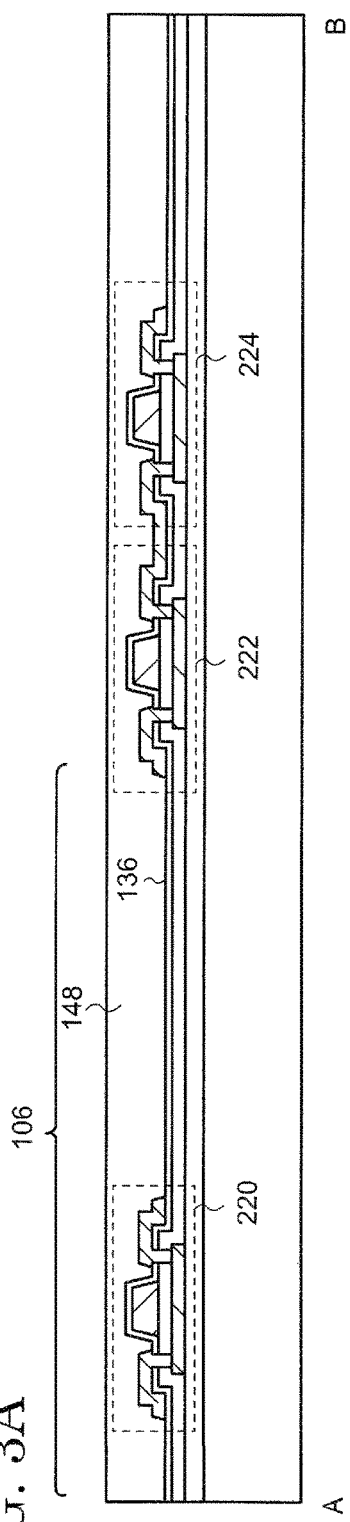
FIG. 3A to FIG. 3C are drawings showing a manufacturing method of a display device, which is an embodiment of the present invention.

Next, a leveling film 148 which is an insulating film is formed over the transistors 220, 222, and 224 (FIG. 3A). It is preferred that the leveling film 148 include a polymer material such as an epoxy resin, an acrylic resin, a polyester, a polyamide, a polyimide, and a polysiloxane. The leveling film 148 can be formed with a wet film-formation method such as a spin-coating method, an ink-jet method, a printing method, and a dip-coating method or a lamination method. The formation of the leveling film 148 allows depressions and projections caused by the transistors 220, 222, 224 to be absorbed, resulting in a flat top surface.

Figure 3B:
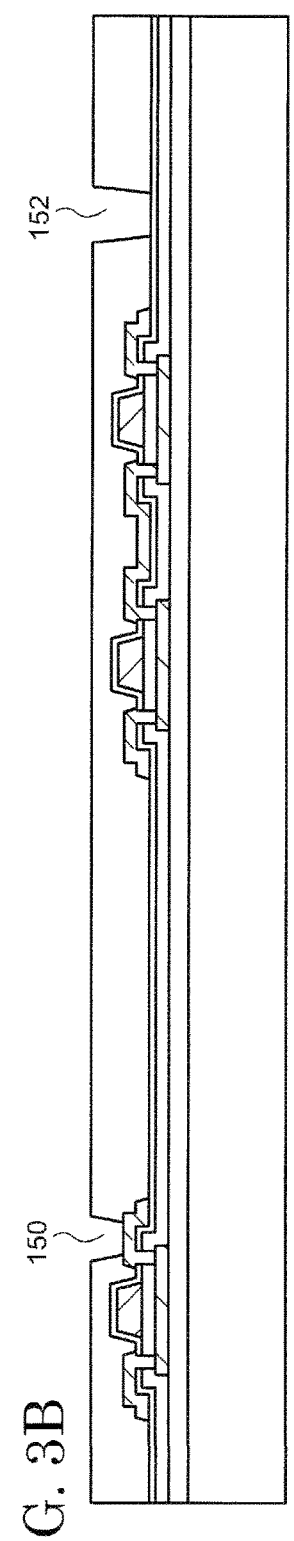

Next, an opening portion 150 reaching the source/drain 140 and an opening portion 152 reaching the interlayer film 136 are formed in the leveling film 148 (FIG. 3B). In the example shown in FIG. 3B, the opening portion 152 is formed in a region which is closer to an edge portion (a right edge portion of the base material 102 in the drawing) of the base material 102 than the driver circuit 110. However, the opening portion 152 may be formed between the driver circuit 110 and the display region 104.

Figure 3C:
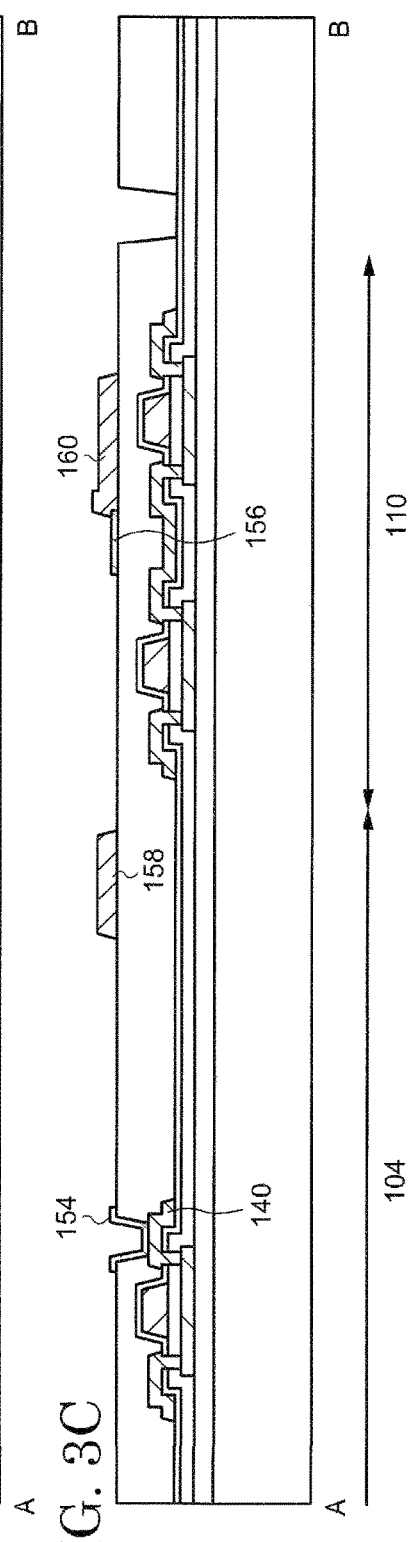

Next, a connection electrode 154 and a power source line 156 are formed (FIG. 3C). The connection electrode 154 is formed so as to cover the opening portion 150, while the power source line 156 is formed over the leveling film 148. The connection electrode 154 and the power source line 156 can be formed, for example, with a conductive oxide such as indium-tin oxide (ITO) and indium-zinc oxide (IZO) by applying a sputtering method and the like. The connection electrode 154 and the power source line 156 can be formed simultaneously existing in the same layer. The power source line 156 is connected to a second electrode 170 of the light-emitting element 240 formed later and has a function to supply a constant voltage to the second electrode 170. Note that, the connection electrode 154 is not necessarily formed. However, the formation of the connection electrode 154 enables protection of the source/drain 140 of the transistor 220 when a first electrode 164 of the light-emitting element 240 and a capacitor electrode 158 are formed, by which an increase in contact resistance can be prevented.

Next, the capacitor electrode 158 and an auxiliary wiring 160 are formed (FIG. 3C). The capacitor electrode 158 and the auxiliary wiring 160 can also exist in the same layer. The capacitor electrode 158 and the auxiliary wiring 160 may be formed with a metal usable in the gates 130, 132, and 134 and the source/drains 138, 140, 142, 144, and 146 or an alloy thereof. The auxiliary wiring 160 is electrically connected to the power source line 156. The auxiliary wiring 160 functions as an auxiliary wiring when a resistance of the second electrode 170 of the light-emitting element 240 formed later is relatively high and is able to prevent a voltage drop which occurs in the second electrode 170. The capacitor electrode 158 forms a capacitor 230 in association with the first electrode 164 of the light-emitting element 240 formed later.

After that, an insulating film 162 is formed (FIG. 4A). The insulating film 162 can be formed by applying the material such as silicon nitride and the formation method, which are available for the gate insulating film 128 and the interlayer film 136. The insulating film 162 has an opening portion to expose a contact portion 186 (i.e., a bottom surface of the connection electrode 154 formed in the opening portion of the leveling film 148) for an electrical connection of the transistor 220 with the light-emitting element 240, an opening portion to expose the power source line 156, and an opening portion 182 to expose a part of a surface of the leveling film 148. As shown in FIG. 4A, it is preferred that the insulating film 162 cover a side surface of the opening portion 152. Note that the opening portion 182 may not be formed.

Next, the first electrode 164 of the light-emitting element 240 is formed (FIG. 4A). When light emission from the light-emitting element 240 is extracted through the base material 102, a material having a light-transmitting property, such as a conductive material exemplified by ITO and IZO, can be used for the first electrode 164. On the other hand, when the light emission from the light-emitting element 240 is extracted from a side opposite to the base material 102, a metal such as aluminum and silver or an alloy thereof can be used. Alternatively, it is possible to employ a stacked layer of the aforementioned metal or alloy and a conductive oxide, such as a stacked structure in which a metal is sandwiched by a conductive oxide (e.g., ITO/silver/ITO). The capacitor 230 is formed by the first electrode 164, the capacitor electrode 158, and the insulating film 162 sandwiched therebetween. Note that, in the present embodiment, an example is shown in which the pixel 106 has one capacitor 230. However, the pixel 106 may contain a plurality of capacitors.

After the formation of the first electrode 164, a partition wall 166 which is an insulating film is formed (FIG. 4A). The partition wall 166 has a function to absorb the steps caused by an edge portion of the first electrode 164 and the contact portion 186 formed in the leveling film 148 and to electrically insulate the first electrodes 164 in the adjacent pixels 106 from each other. The partition wall 166 is also called a bank (rib). The partition wall 166 can be formed with a material usable for the leveling film 148, such as an epoxy resin. The partition wall 166 has openings to expose the first electrode 164, a part of the power source line 156, and the opening portion 152, and it is preferred that edges of the openings have a moderately tapered shape. Steep edges of the openings readily cause a coverage defect of an EL layer 168 and the second electrode 170 formed later.

Here, the leveling film 148 and the partition wall 166 contact with each other through the opening portion 182 formed in the insulating film 162 which is located between the leveling film 148 and the partition wall 166. With such a structure, a gas such as water eliminated from the leveling film 148 in a heating treatment and the like performed after the formation of the partition wall 166 can be released through the partition wall 166.

After forming the partition wall 166, the EL layer 168 of the light-emitting element 240 is formed so as to cover the first electrode 164 and the partition wall 166 (FIG. 4B). The EL layer 168 can be formed with an evaporation method or the aforementioned wet film-forming method. When the EL layer 168 is formed with an evaporation method, it is preferred to use a mask 200. Specifically, the EL layer 168 is formed by disposing the mask 200 over the base material 102 so that an opening portion 202 of the mask 200 overlaps with the first electrode 164, exposing the first electrode 164 to vapor of a material forming the EL layer 168 under a high vacuum, and depositing the material. In FIG. 4B, the mask 200 is illustrated so as to be placed over the base material 102. However, the evaporative deposition may be performed by arranging an evaporation source charged with a material under the base material 102, disposing the base material 102 so that the first electrode 164 faces the evaporation source, and placing the mask 200 between the evaporation source and the base material 102.

In FIG. 4B, the EL layer 168 is illustrated so as to have a single layer. However, the present embodiment is not limited to such a mode, and the EL layer 168 may have a plurality of layers. For example, the EL layer 168 can be formed by appropriately combining a carrier-injection layer, a carrier-transporting layer, an emission layer, a carrier-blocking layer, an exciton-blocking layer, and the like. Furthermore, the structure of the EL layer 168 may be different between the adjacent pixels 106. For example, the EL layer 168 may be configured so that the emission layer is different, but other layers have the same structure between the adjacent pixels 106. With this structure, different emission colors can be obtained from the adjacent pixels 106, by which full color display can be performed. On the contrary, the same EL layer 168 may be used in all of the pixels 106. In this case, the EL layer 168 giving white emission may be formed so as to be shared by all of the pixels 106, and a wavelength of light extracted from each pixel 106 is selected by using a color filter and the like.

After forming the EL layer 168, the second electrode 170 is formed (FIG. 5A). The light-emitting element 240 is formed by the first electrode 164, the EL layer 168, and the second electrode 170. Carriers (holes and electrons) are injected from the first electrode 164 and the second electrode 170 to the EL layer 168, and the light emission is attained through a process in which an excited state generated by carrier recombination is relaxed to a ground state. Hence, in the light-emitting element 240, a region in which the EL layer 168 and the first electrode 164 are in direct contact with each other is an emission region.

When the light emission from the light-emitting element 240 is extracted through the base material 102, a metal such as aluminum and silver or an alloy thereof can be used for the second electrode 170. On the other hand, when the light-emission from the light-emitting element 240 is extracted through the second electrode 170, the second electrode 170 is formed with the aforementioned metal or alloy so as to have a thickness which allows visible light to pass therethrough. Alternatively, a material having a light-transmitting property, such as a conductive oxide exemplified by ITO ad IZO, can be used for the second electrode 170. Furthermore, a stacked-layer structure of the aforementioned metal or alloy and a conductive oxide (e.g., Mg—Ag/ITO) can be employed for the second electrode 170.

The second electrode 170 can be formed with an evaporation method, a sputtering method, and the like. In this case, similar to the formation of the EL layer 168, the second electrode 170 may by formed in a necessary region by using a mask 210. For example, as shown in FIG. 5A, the second electrode 170 is formed by arranging the mask 210 having an opening portion 212 so that the opening portion 212 of the mask 210 overlaps with the three opening portions of the partition wall 166 (that is so as to overlap with the EL layer 168, the power source line 156, and the opening portion 152) and depositing the aforementioned material by passing through the opening 212 of the mask 210.

Next as shown in FIG. 5B, an organic layer 180 which is an insulating film is formed over the second electrode 170. A polymer material can be used for the organic layer 180, for example, and the polymer material can be selected from an epoxy resin, an acrylic resin, a polyimide, a polyester, a polycarbonate, and the like. A material which is the same as that included in the partition wall 166 or a material exhibiting an etching rate which is the same as or similar to that included in the partition wall 166 is preferably used. Although the organic layer 180 can be formed by the aforementioned wet film-forming method, the organic layer 180 may be formed by gasifying or atomizing oligomers serving as a raw material of the aforementioned polymer material under a reduced pressure, spraying the base material 102 with the gasified or atomized oligomers, and then polymerizing the oligomers. In this case, a polymerization initiator may be mixed in the oligomers. Furthermore, the substrate 102 may be sprayed with the oligomers while cooling the base material 102.

The organic layer 180 may be formed so as to give a substantially flat top surface. In FIG. 5B, an example is shown in which the organic layer 180 has a substantially flat top surface except in a region overlapping with the opening portion 152. That is, it is preferred that the organic layer 180 be formed so as to give a flat top surface over the light-emitting element 240 and the partition wall 166 which is covered with the EL layer 168 of the light-emitting element 240. In this case, the second electrode 170 over the partition wall 166 is covered with the organic layer 180, and the partition wall 166 is embedded in the organic layer 180. Note that the second electrode 170 is completely covered with the organic layer 180 in FIG. 5B. However, a part of the second electrode 170 may be exposed from the organic layer 180.

Figure 6A:
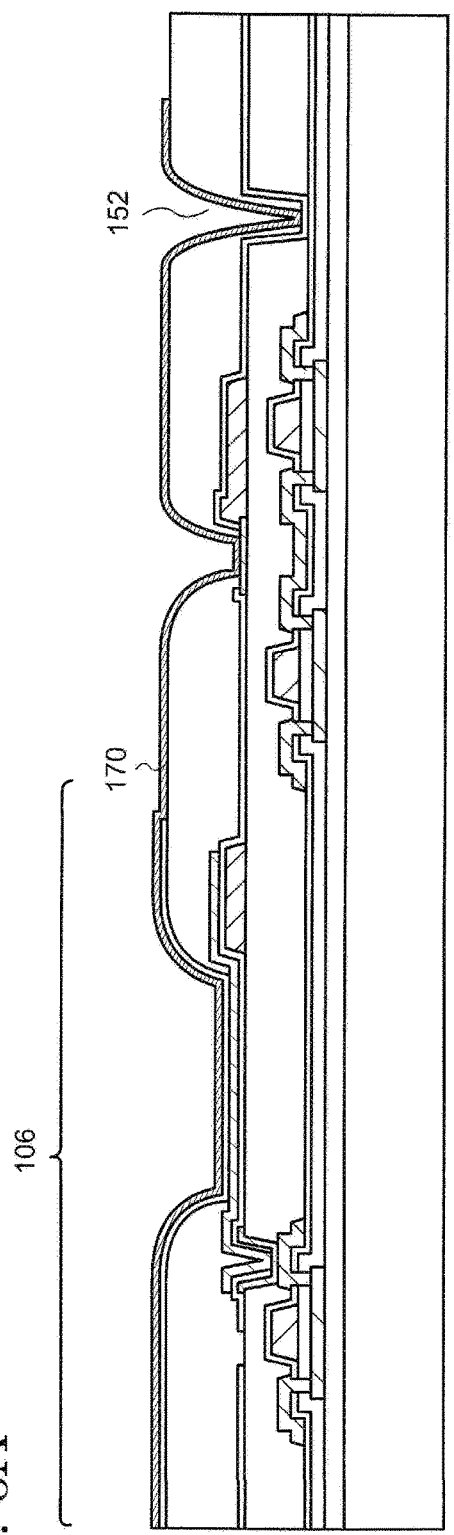
FIG. 6A and FIG. 6B are drawings showing a manufacturing method of a display device, which is an embodiment of the present invention.

Next, the organic layer 180 is removed (FIG. 6A). The removal of the organic layer 180 is preferably carried out by etching in the presence of plasma (hereinafter, referred to as a plasma treatment). It is particularly preferred to perform the removal of the organic layer 180 under the conditions that the organic layer 180 is anisotropically etched. For example, the plasma treatment is performed in the presence of a gas containing oxygen, such as an oxygen gas ($O_2$), ozone ($O_3$), nitrogen monoxide (NO), or nitrogen dioxide ($NO_2$). Specifically, the base material 102 is placed between a pair of electrodes, plasma is generated by applying a high frequency power source (e.g., RF power of 13.56 MHz) between the electrodes, and the organic layer 180 is reacted with the plasma. It is preferred that the organic layer 180 be removed so as to expose the second electrode 170.

Figure 6B:
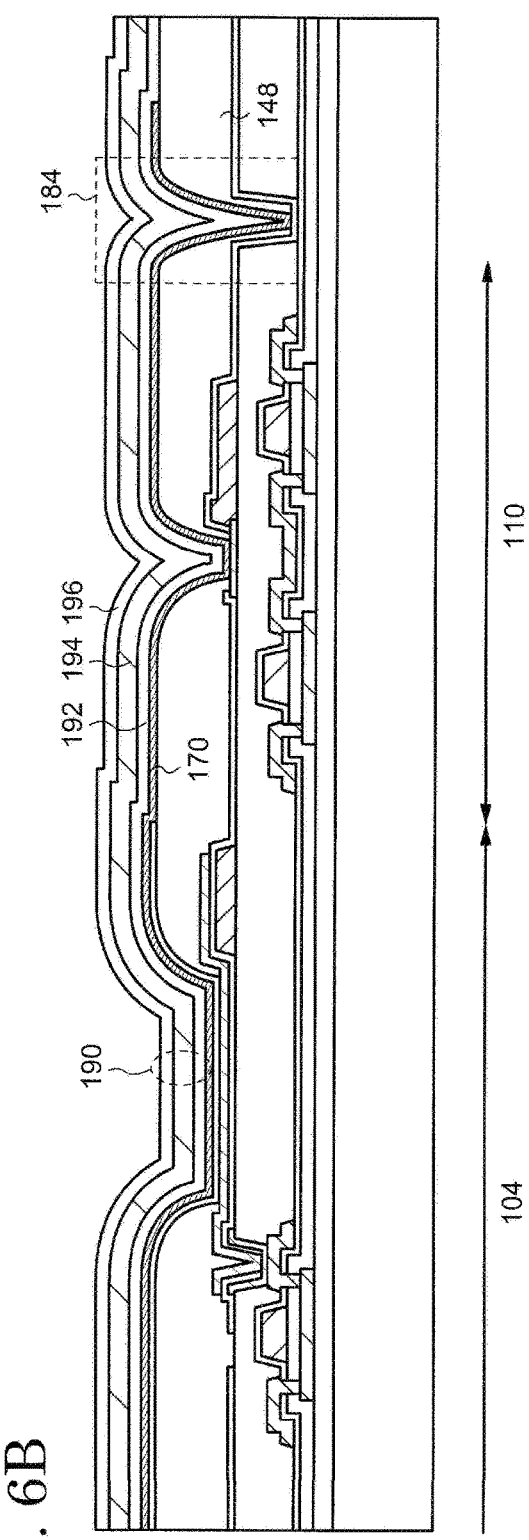

After the removal of the organic layer 180, a passivation film (sealing film) 190 is formed (FIG. 6B). The passivation film 190 has a function to prevent entrance of water to the precedingly formed light-emitting element 240 from outside and is preferred to have a high gas-blocking property. For example, it is preferred to form the passivation film 190 so as to include an inorganic material such as silicon nitride, silicon oxide, silicon nitride oxide, and silicon oxynitride. Alternatively, an organic resin including an acrylic resin, a polysiloxane, a polyimide, a polyester, or the like may be used. In the structure shown in FIG. 6B, the passivation film 190 has a three-layer structure including a first layer 192, a second layer 194, and a third layer 196.

In the three-layer structure shown in FIG. 6B, the first layer 192 is preferably a film formed with an inorganic material. Specifically, the first film 192 includes an inorganic insulator such as silicon nitride, silicon oxide, silicon oxynitride, and silicon nitride oxide and is formed with a CVD method or a sputtering method. The second layer 194 can be formed with the material usable for the organic layer 180 and the method applicable for the organic layer 180. The second layer 194 is preferably formed with the same material as the organic layer 180. The third layer 196 can be formed with the material and the formation method which are the same as those of the first layer 192.

Here, in the opening portion 152 of the leveling film 148, a sidewall and a bottom surface of the leveling film 148 are covered with the insulating film 162, the second electrode 170 and the passivation film 190. With such a structure, it is possible to prevent impurities such as water and oxygen from entering the driver circuit 110 and the displayer region 104 from an edge portion of the display device 100 (a right edge of the cross-sectional view in FIG. 6B) through the leveling film 148 and the partition wall 166 which have relatively high permeability to a gas such as vapor and an oxygen gas. Hence, a structure 184 in this portion is called a water-blocking structure or a water-blocking region.

Although not shown, an opposing substrate may be provided as an optional structure over the passivation film 190. The opposing substrate is fixed to the base material 102 with an adhesive. In this case, a space between the opposing substrate and the passivation film 190 may be filled with an inert gas or a filler such as a resin. Alternatively, the passivation film 190 may be directly bonded to the opposing substrate with an adhesive. When a filler is used, it is preferred that the filler have a high transmitting property with respect to visible light. When the opposing substrate is fixed to the base material 102, a gap therebetween may be adjusted by including a spacer in the adhesive or the filler.

Alternatively, a structural member serving as a spacer may be formed between the pixels 106.

Furthermore, a light-shielding film having an opening in a region overlapping with the emission region or a color filter overlapping with the emission region may be provided to the opposing substrate. The light-shielding film is formed with a metal having a relatively low reflectance, such as chromium and molybdenum, or a resin material including a coloring material of black or a similar color and has a function to block light other than the light directly obtained from the emission region, such as scattered light, or to suppress reflection of outside light. Optical properties of the color filter may be changed between adjacent pixels 106 so that light emission with a red, green, or blue color is extracted, for example. The light-shielding film and the color filter may be formed over the opposing substrate with a base film interposed therebetween, and an overcoat layer may be further provided so as to cover the light-shielding film and the color filter.

The aforementioned manufacturing method of the display device 100 is effective in improving lifetime of the display device 100. The reason is explained by using FIG. 7A to FIG. 7C.

Figure 7A:
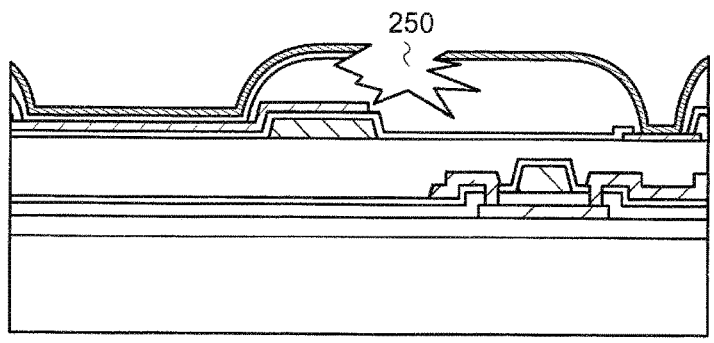
FIG. 7A to FIG. 7C are cross-sectional views showing a manufacturing method of a display device.

As described above, when the EL layer 168 and the second electrode 170 are formed, the masks 200 and 210 may be used (see FIG. 4B and FIG. 5A), and it is preferred to arrange the masks 200 and 210 as close as possible to the base material 102 (i.e., to the partition wall 166 and the EL layer 168 formed thereover) in order to accurately form the EL layer 168 and the second electrode 170 over the first electrode 164. This is because, if the masks 200 and 210 are distanced from the base material 102, vapor of an evaporated material or target atoms passing through the opening portions 202 and 212 of the masks 200 and 210 are spread out and deposited in a region larger than the opening portions 202 and 212. Hence, when the masks 200 and 210 are aligned or removed, the masks 200 and 210 may contact with the base material 102, which results in damage in the partition wall 166 placed in the upmost position. As schematically shown in FIG. 7A, the damage of the partition wall 166 accompanies damage of the EL layer 168 and the second electrode 170 formed thereover, thereby exposing the partition wall 166.

Figure 7B:
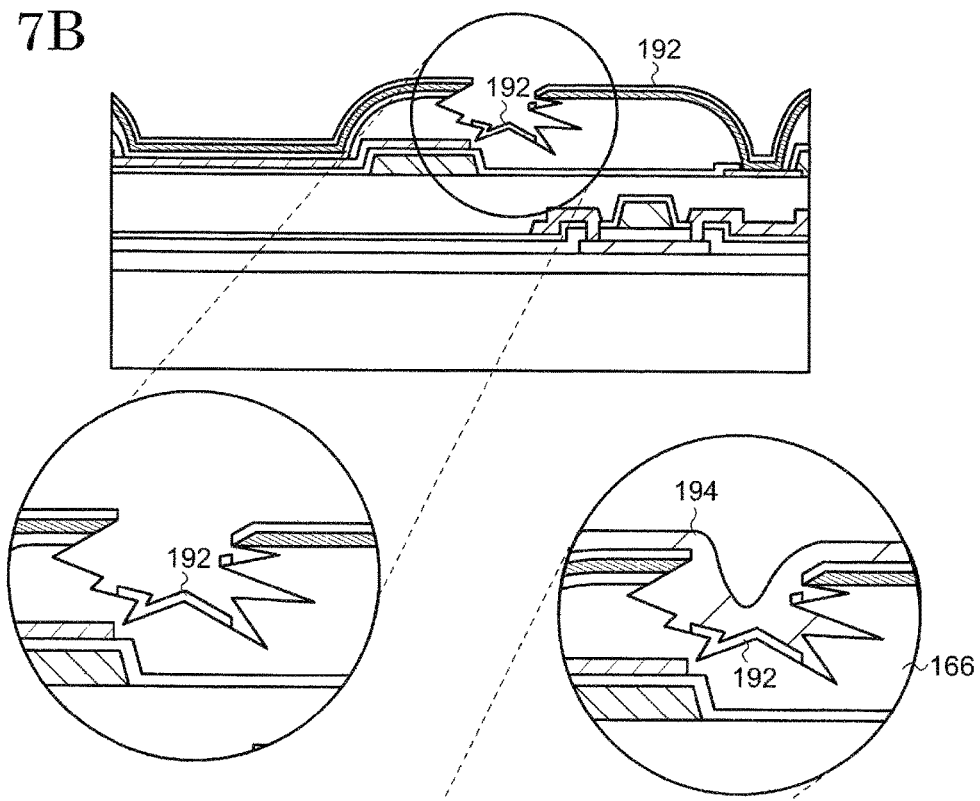
Figure 7C:
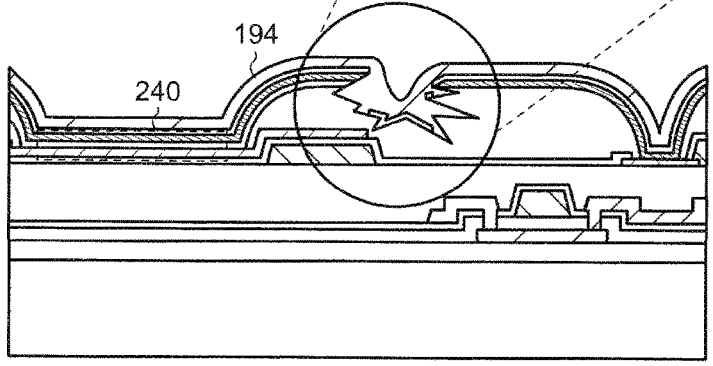

If the passivation film 190 having the three-layer structure shown in FIG. 6B is formed in such a state, for example, the first layer 192 is able to cover only a part of the damaged portion 250, and the inside of the damaged portion 250 is not covered with the first layer 192 (see FIG. 7B). Accordingly, as shown in FIG. 7C, the second layer 194 and the partition wall 166 directly contact with each other, and the effect of the passivation film 190 to prevent the entrance of impurities is decreased. If impurities enter the partition wall 166 and further enter the light-emitting element 240, emission efficiency of the light-emitting element 240 is gradually decreased as the display device 100 is driven. Alternatively, the impurities inhibit the light-emission, and the pixel 106 is finally recognized as a non-emissive pixel. The non-emissive pixel is also called a dark spot (DS) and significantly reduces display quality, by which commercial value of the display device 100 substantially disappears. Additionally, it is unfortunately very difficult to detect or find the dark spot immediately after manufacturing the display device 100, which makes it difficult to solve the problem regarding the dark spot.

Figure 8A:
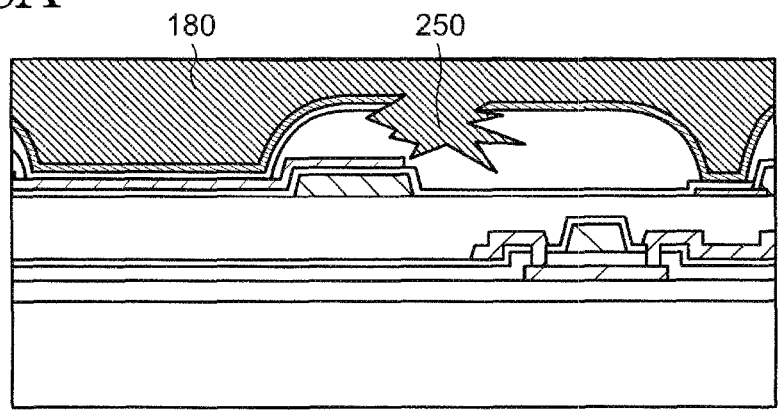
FIG. 8A to FIG. 8C are drawings showing a manufacturing method of a display device, which is an embodiment of the present invention.
Figure 8B:
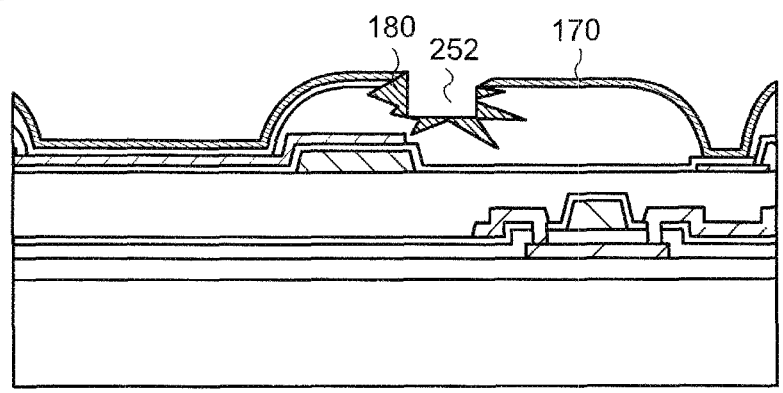

On the other hand, in the case where the manufacturing method of the display device 100 according to the present embodiment is applied, even if the partition wall 166 is damaged and exposed by contact with the masks 200 and 210, the damaged portion 250 can be covered with the organic layer 180 formed later as shown in FIG. 8A. Particularly, when a polymer material is used for the organic layer 180, the damaged portion 250 is effectively filled. As a result, the damaged portion 250 is filled with the organic layer 180, and the partition wall 166 is in contact with the organic layer 180 in the damaged portion 250. In the subsequent anisotropic etching of the organic layer 180 by the plasma treatment, the etching proceeds in a perpendicular direction from an edge portion of the second electrode 170 of the damaged portion 250, by which the damaged portion 250 is processed into a depression 252 as shown in FIG. 8B. Therefore, a part of the organic layer 180 remains in a region inside from the edge portion of the second electrode 170 of the damaged portion 250, and the region inside from the edge portion of the second electrode 170 can be filled with the remaining organic layer 180. Namely, a side surface and a bottom surface of the damaged portion 250 do not have an irregular structure caused by the damage, which is an uncontrollable phenomenon, but possess surfaces which are substantially perpendicular or parallel to a surface of the base material 102, respectively. Particularly, when the organic layer 180 and the partition wall 166 each have a polymer material or have the same material, the organic layer 180 and the partition wall 166 are etched at the same or substantially the same rate in the damaged region 250. Hence, a part of the organic layer 180 and a part of the partition wall 166 are both etched, by which the depression 250 having a well-defined structure can be formed. As described above, the formation of the organic layer 180 and the sequential plasma treatment enable reconstruction of the damaged portion 250 into the depression 252 with a well-defined structure.

Figure 8C:
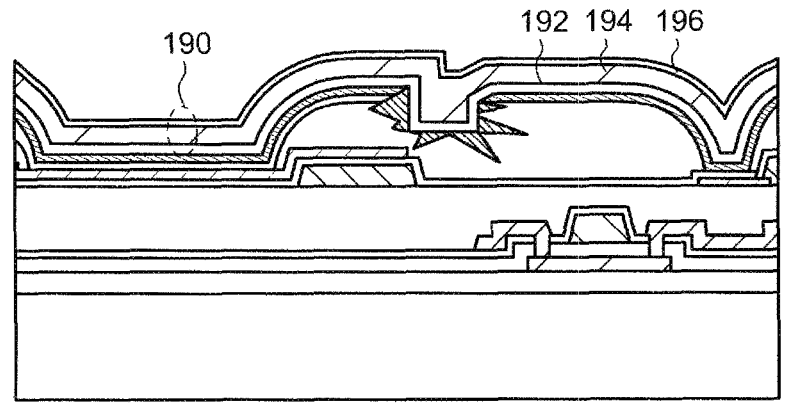

The formation of the first layer 192 of the passivation film 190 in this state allows the side surface and the bottom surface of the damaged portion 250 to be covered with the first layer 192, thereby preventing the second layer 194 and the partition wall 166 from directly contacting with each other (FIG. 8C). Hence, the light-emitting element 240 can be effectively protected with the passivation film 190. Accordingly, generation of the dark spot can be effectively suppressed, and reliability of the display device 100 can be improved.

Second Embodiment

In the present embodiment, a manufacturing method of a display device, which is different from that of the First Embodiment, is explained by using FIG. 9A to FIG. 12. In the present embodiment, a method for manufacturing a display device 300 having flexibility is described. Description of the structures which are the same as those of the First Embodiment may be omitted.

Figure 9A:
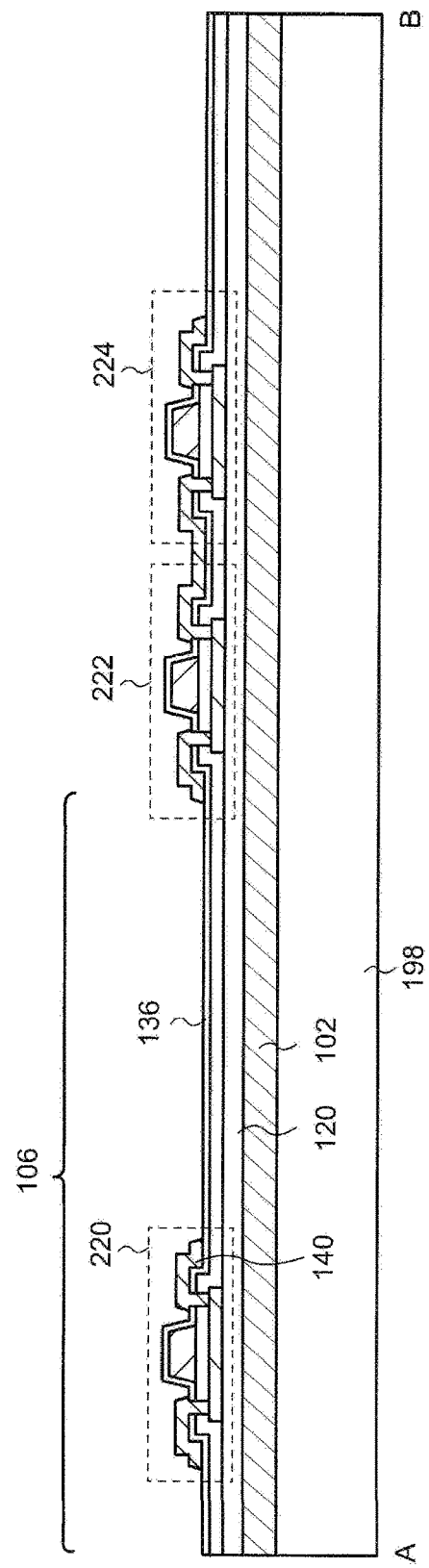
FIG. 9A and FIG. 9B are drawings showing a manufacturing method of a display device, which is an embodiment of the present invention.

First, the base material 102 is formed over a substrate 198 (FIG. 9A). The substrate 198 has a function to hold the base material 102 and each element formed over the base material 102, and therefore, a material with physical strength sufficient for this function and heat resistance and chemical stability to the process for fabricating each element can be used as the substrate 198. Specifically, glass, quartz, plastics, a metal, ceramics, and the like can be used. A material which transmits light used in the light-irradiation process described below is preferably used. The substrate 198 is also called a supporting substrate.

The base material 102 can include the materials which are the same as those described in the First Embodiment, and a polymer material such as a polyimide, a polyamide, a polyester, and a polycarbonate can be used specifically. The base material 102 can be formed with the aforementioned wet film-forming method or a lamination method. Note that the base material 102 is formed at a thickness which allows the base material 102 to independently possess flexibility sufficient for manufacturing the flexible display device 300.

Figure 9B:
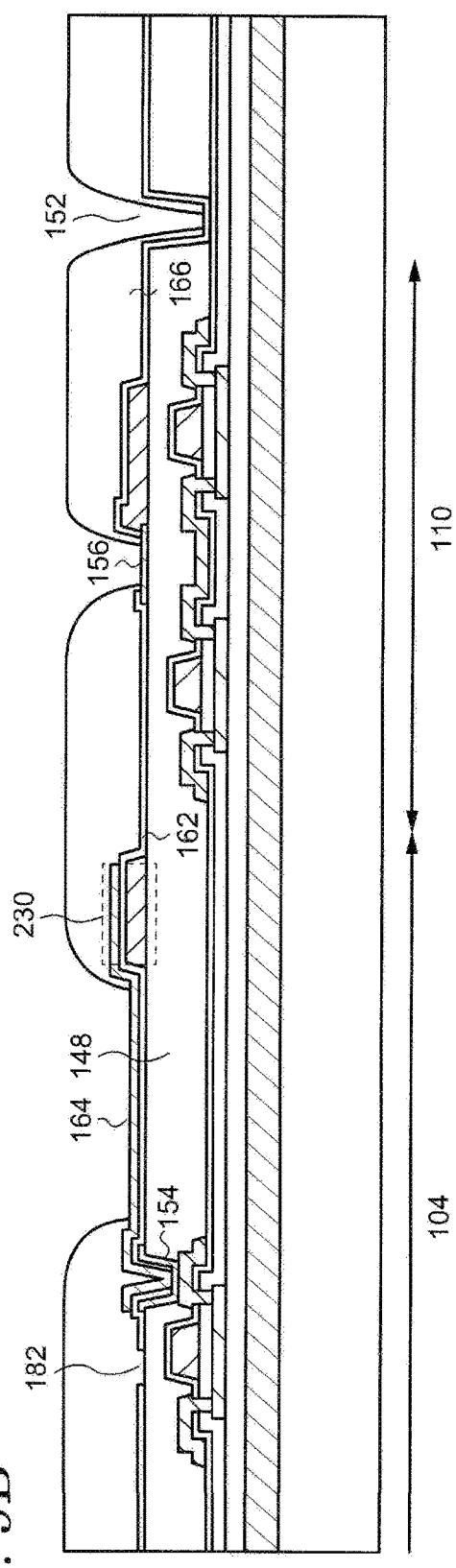

Similar to the First Embodiment, the transistors 220, 222, and 224 are formed over the base material 102 with the undercoat 120 interposed therebetween. After that, the interlayer film 136 and the leveling film 148 are formed over the transistors 220, 222, and 224 (FIG. 9B), and the opening portion reaching the source/drain 140 of the transistor 220 is formed in the leveling film 148. Note that an example is shown in FIG. 9B in which, similar to the First Embodiment, the opening portion 152 is provided for the water-blocking structure 184. However, the introduction of the water-blocking structure 184 is optional.

After that, the connection electrode 154, the power source line 156, and the insulating film 162 thereover are formed. The opening portion 182 for exposing a part of the surface of the leveling film 148 and the opening portion overlapping with the power source line 156 are formed in the insulating film 162. However, the formation of the former is optional, and the former may not be formed. After that, the first electrode 164 is formed over the insulating film 162 (FIG. 9B).

Similar to the First Embodiment, the partition wall 166 is formed over the first electrode 164, and the light-emitting element 240 is further formed by sequentially forming the EL layer 168 and the second electrode 170 so as to overlap with the first electrode 164 and the partition wall 166 (FIG. 10A).

Next, as shown in FIG. 10B, the organic layer 180 is formed over the second electrode 170. It is preferred that the organic layer 180 be formed so as to give a substantially flat top surface, and it is particularly preferred to give a flat top surface over the light-emitting element 240 and the partition wall 166 which is covered with the EL layer 168. In this case, the partition wall 166 and the second electrode 170 are covered with the organic layer 180. Note that, in FIG. 10B, an embodiment is shown in which the second electrode 170 is completely covered with the organic layer 180. However, the organic layer 180 may be formed so that the second electrode 170 is partly exposed.

Figure 11A:
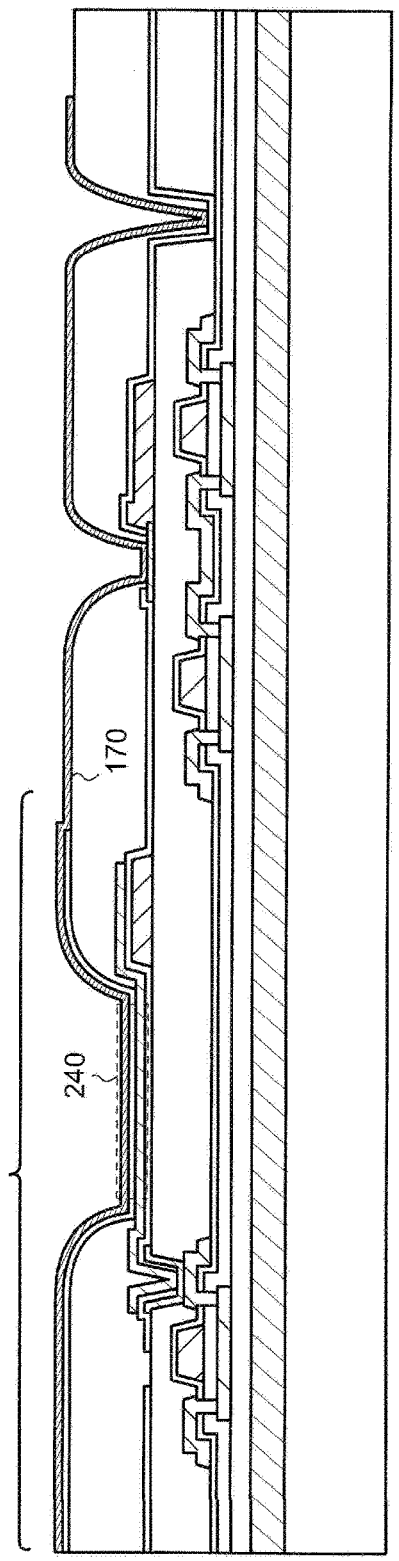
FIG. 11A and FIG. 11B are drawings showing a manufacturing method of a display device, which is an embodiment of the present invention.
Figure 11B:
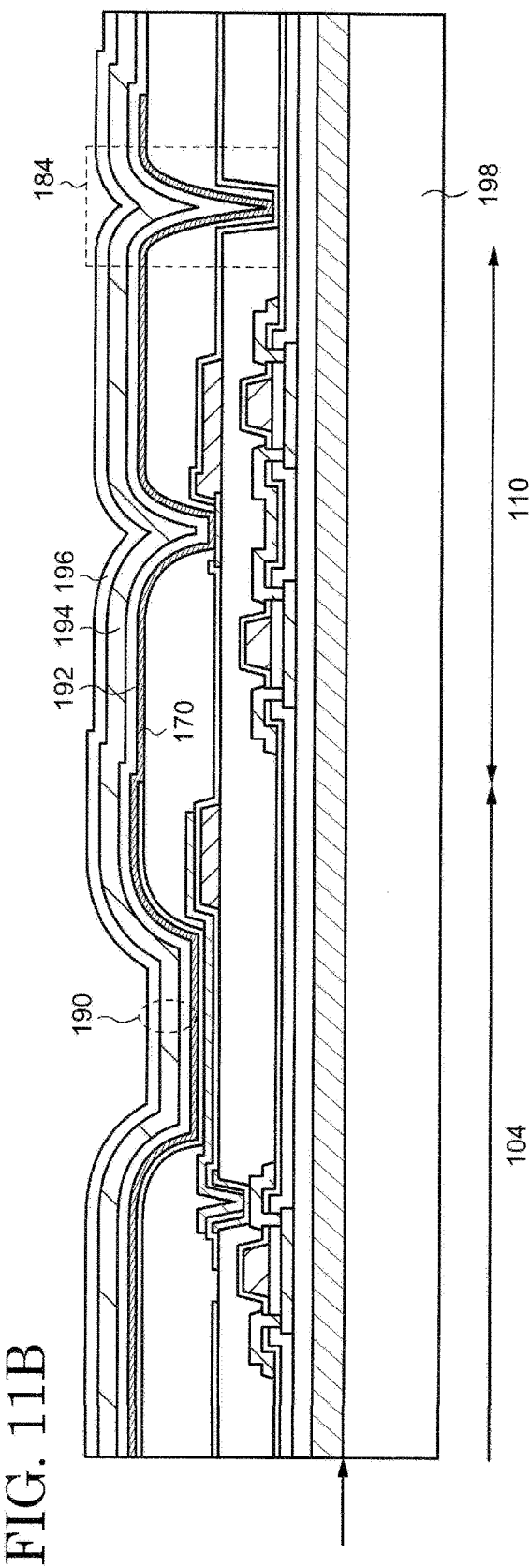
Figure 12:
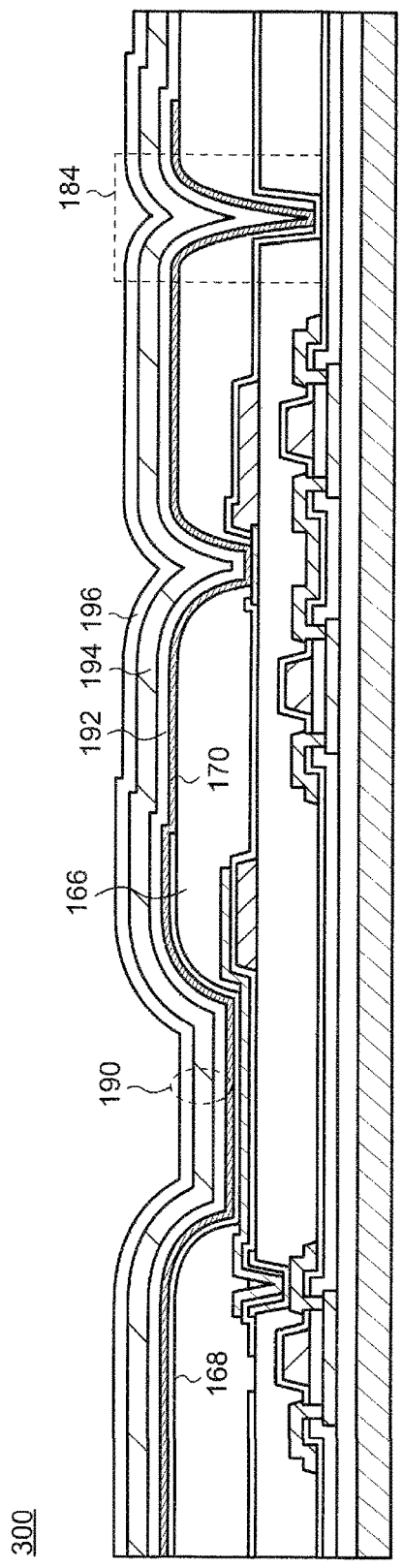
FIG. 12 is a drawing showing a manufacturing method of a display device, which is an embodiment of the present invention.

Next, as shown in FIG. 11A, the organic layer 180 is removed. The removal of the organic layer 180 can be carried out with a plasma treatment. After that, as shown in FIG. 11B, the passivation film 190 is formed.

After that, the base material 102 is irradiated with light by utilizing a laser-light source, a flash light, or the like by which adhesion between the base material 102 and the substrate 198 can be reduced. The light is preferably applied from a side of the substrate 198. After that, the substrate 198 is separated along an interface indicated with an arrow in FIG. 11B, i.e., an interface between the base material 102 and the substrate 198, by which the display device 300 according to an embodiment of the present invention shown in FIG. 12 can be obtained.

The manufacturing method shown in the First Embodiment is also applied to the display device 300 of the present embodiment. Namely, the organic layer 180 is formed over the second electrode 170 to cover the second electrode 170 over the partition wall 166, which is followed by the removal of the organic layer 180 with a plasma treatment. Therefore, even if a part of the display device 300, such as the partition wall 166, the EL layer 168, and the second electrode 170 formed over the partition wall 166, is damaged, the damaged portion 250 can be processed and reconstructed to the depression 250 with a well-defined structure. Moreover, the side surface and the bottom surface of the damaged portion 250 can be covered with, for example, an inorganic material used in the first layer 192 by forming the passivation film 190. Hence, entrance of impurities from outside can be effectively prevented, and generation of the dark spot can be suppressed, by which a display device with high reliability can be provided.

Third Embodiment

As described in the First Embodiment, the use of the manufacturing method of an embodiment according to the present embodiment allows the damaged portion 250 in the partition wall 166 to be processed and reconstructed into the depression 252 with a well-defined structure. As a result, a highly reliable display device can be attained. Thus, a display device which is manufactured by the manufacturing method of the display devices 100 and 300 shown in the First and Second Embodiments and which is subjected to the processing of the damaged portion 250 is an embodiment of the present invention. An example is shown as a display device 400 in FIG. 13.

Figure 13:
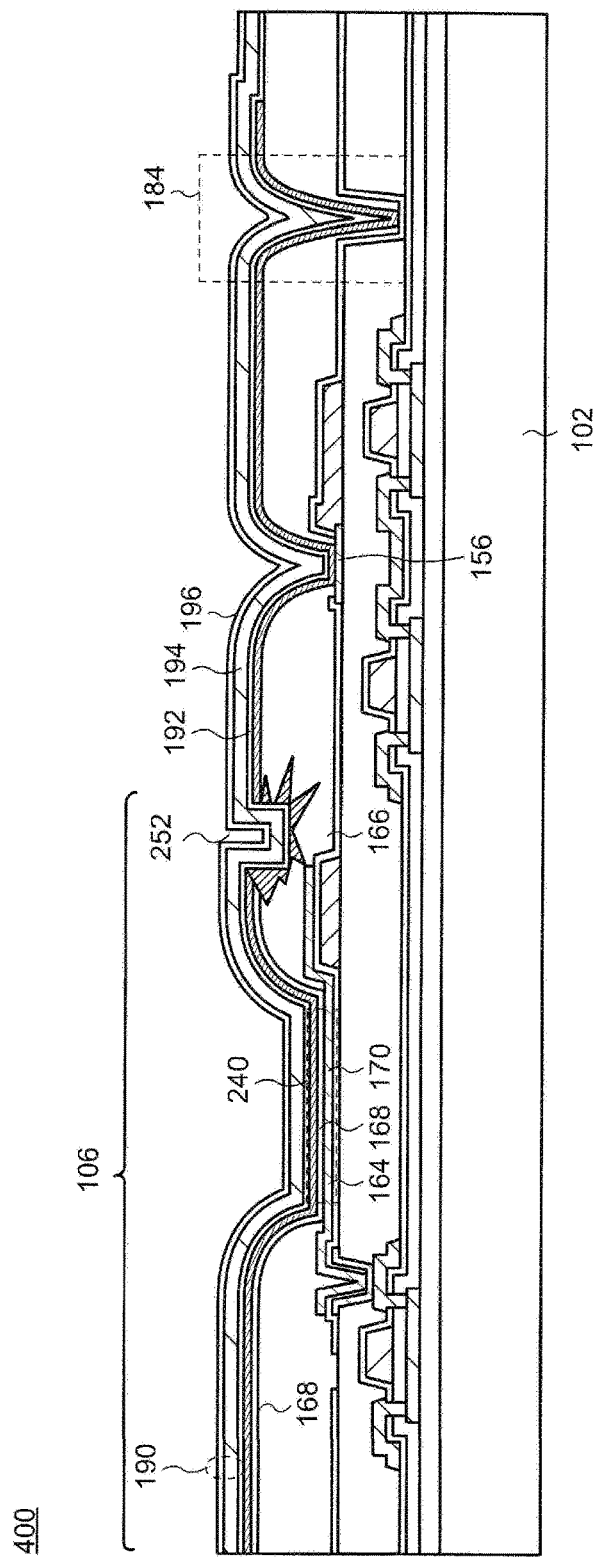
FIG. 13 is a cross-sectional view of a display device which is an embodiment of the present invention.

As shown in FIG. 13, the display device 400 possesses the base material 102 and the light-emitting element 240 thereover. The light-emitting element 240 has the first electrode 164, the second electrode 170, and the EL layer 168 sandwiched therebetween. The display device 400 further includes the partition wall 166 which covers an edge portion of the first electrode 164 and has an opening portion overlapping with the first electrode 164.

This partition wall 166 partly possesses the depression 252 which is a scooped structure. The depression 252 is positioned in a region which does not overlap with the emission region (the region in which the EL layer 168 and the first electrode 164 directly contact with each other). The side surface and the bottom surface of the depression 252 are substantially perpendicular and parallel to the top surface of the base material 102, respectively, and are covered with the first layer 192 of the passivation film 190. The first layer 192 may include an inorganic insulator as described in the First Embodiment.

The passivation film 190 further has the second layer 194 and the third layer 196. As described in the First Embodiment, the second layer 194 and the third layer 196 may contain an organic insulator and an inorganic insulator, respectively.

In FIG. 13, the depression 252 is illustrated so as to be located between the power source line 156 and the pixel 106 adjacent to the power source line 156. However, the display device 400 of the present embodiment is not limited to such a mode, and the depression 252 may be positioned between an arbitrarily selected pixel 106 and the pixel 106 adjacent thereto.

In the display device 400 of the present embodiment, the partition wall 166 and the light-emitting element 240 are each covered with the passivation film 190 having a three-layer structure. Therefore, entrance of impurities to the light-emitting element 240 from outside is effectively prevented. As a result, generation of the dark spot is markedly suppressed, and the display device 400 has improved reliability.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A manufacturing method of a display device, the manufacturing method comprising:
forming a first electrode;
forming a first insulating film covering an edge portion of the first electrode and having an opening portion overlapping with the first electrode;
forming an EL layer over the first electrode and the first insulating film;
forming a second electrode over the EL layer;
forming a second insulating film over the second electrode so as to overlap with the first insulating film;
removing the second insulating film; and
forming a sealing film over the second electrode,
wherein the second insulating film is formed so as to have a flat top surface over the first insulating film.

2. The manufacturing method according to claim 1, wherein the second insulating film is formed so as to cover the first insulating film.

3. The manufacturing method according to claim 1, wherein the removal of the second insulating film is carried out with a plasma treatment.

4. The manufacturing method according to claim 3, wherein the plasma treatment is performed in the presence of a gas including oxygen.

5. The manufacturing method according to claim 3, wherein the plasma treatment is performed so that the second insulating film is anisotropically etched.

6. The manufacturing method according to claim 1, wherein the first insulating film and the second insulating film each comprise an organic compound.

7. The manufacturing method according to claim 6, wherein the organic compound includes an acrylic resin.

8. The manufacturing method according to claim 1, wherein the first insulating film and the second insulating film include the same material.

9. The manufacturing method according to claim 1, wherein the sealing film comprises:
a first layer including an inorganic compound;
a second layer over the first layer, the second layer including an organic compound; and
a third layer over the second layer, the third layer including an inorganic compound.

10. A manufacturing method of a display device, the manufacturing method comprising:
forming a first electrode;

forming a first insulating film covering an edge portion of the first electrode and having an opening portion overlapping with the first electrode;

forming an EL layer over the first electrode and the first insulating film;

arranging a mask having an opening portion between the first insulating film and an evaporation source so as to be in contact with the first insulating film;

forming a second electrode over the EL layer through the opening portion of the mask;

forming a second insulating film over the second electrode so as to overlap with the first insulating film;

removing the second insulating film; and forming a sealing film over the second electrode.

11. The manufacturing method according to claim 10, wherein the second insulating film is formed so as to cover the first insulating film.

12. The manufacturing method according to claim 10, wherein the second insulating film is formed so as to have a flat top surface over the first insulating film.

13. The manufacturing method according to claim 10, wherein the removal of the second insulating film is carried out with a plasma treatment.

14. The manufacturing method according to claim 13, wherein the plasma treatment is performed in the presence of a gas including oxygen.

15. The manufacturing method according to claim 13, wherein the plasma treatment is performed so that the second insulating film is anisotropically etched.

16. The manufacturing method according to claim 10, wherein the first insulating film and the second insulating film each comprise an organic compound.

17. The manufacturing method according to claim 16, wherein the organic compound includes an acrylic resin.

18. The manufacturing method according to claim 10, wherein the first insulating film and the second insulating film include the same material.

19. The manufacturing method according to claim 10, wherein the sealing film comprises:
a first layer including an inorganic compound;
a second layer over the first layer, the second layer including an organic compound; and
a third layer over the second layer, the third layer including an inorganic compound.

20. The manufacturing method according to claim 10, wherein the second insulating film is formed so as to cover a damaged portion of the first insulating film, the damaged portion resulting from contact with the mask.

21. The manufacturing method according to claim 20, wherein the damaged portion has a depression, and
wherein the second insulating film is formed so as to fill the depression.

22. The manufacturing method according to claim 10, wherein a part of the first insulating film is removed when the second insulating film is removed.

23. The manufacturing method according to claim 21, wherein the second insulating film is removed so that a part of the second insulating film remains in the depression.

24. The manufacturing method according to claim 1, wherein the removal of the second insulating film is performed so that a part of the second insulating film is left in the first insulating film.

25. The manufacturing method according to claim 10, wherein the removal of the second insulating film is performed so that a part of the second insulating film is left in the first insulating film.

* * * * *